(12) United States Patent
Nakatani et al.

(10) Patent No.: US 11,493,197 B2
(45) Date of Patent: Nov. 8, 2022

(54) LIGHT SOURCE UNIT AND LIGHT IRRADIATION DEVICE

(71) Applicant: Ushio Denki Kabushiki Kaisha, Tokyo (JP)

(72) Inventors: Takeshi Nakatani, Tokyo (JP); Takafumi Mizojiri, Tokyo (JP); Satoshi Murakami, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/459,361

(22) Filed: Aug. 27, 2021

(65) Prior Publication Data

US 2022/0065433 A1    Mar. 3, 2022

(30) Foreign Application Priority Data

Aug. 28, 2020    (JP) .............................. JP2020-144831

(51) Int. Cl.
| | |
|---|---|
| *H01L 33/64* | (2010.01) |
| *F21V 29/56* | (2015.01) |
| *F21Y 105/10* | (2016.01) |
| *F21Y 115/10* | (2016.01) |

(52) U.S. Cl.
CPC ........... *F21V 29/56* (2015.01); *F21Y 2105/10* (2016.08); *F21Y 2115/10* (2016.08)

(58) Field of Classification Search
CPC ............. F21Y 2105/10; F21Y 2115/10; H05B 3/0047; F21V 29/56; F21V 29/65; F21V 29/51; F21V 29/59; F21V 29/58; F21S 45/43; F21S 45/46; F21S 9/046; F28D 15/043; H01L 33/648; F21K 9/00; H05K 2201/10106; Y10S 362/80
See application file for complete search history.

(56) References Cited

U.S. PATENT DOCUMENTS

| | | | |
|---|---|---|---|
| 2012/0155094 A1* | 6/2012 | DeRose | ................. F21V 29/56 362/373 |
| 2012/0328273 A1 | 12/2012 | Kawano et al. | |

FOREIGN PATENT DOCUMENTS

| | | | |
|---|---|---|---|
| CN | 210429153 U | * | 4/2020 |
| JP | 2013-008752 A | | 1/2013 |
| KR | 466198 Y1 | * | 4/2013 |

* cited by examiner

*Primary Examiner* — Omar Rojas Cadima
(74) *Attorney, Agent, or Firm* — Studebaker & Brackett PC

(57) ABSTRACT

A light source unit includes a plurality of LED elements; an LED substrate that comprises a plurality of subdivided regions arrayed in a circumferential direction at least at an outwardmost locus as viewed from a direction perpendicular to the mounting surface; and cooling member(s) which are provided at surface(s) on a side opposite the mounting surface of the LED substrate and at which provided at each of the plurality of subdivided regions there are inlet port(s) for flow thereinto of cooling medium for cooling LED element(s), outlet port(s) that are for discharge of cooling medium and that are disposed more toward a center of the LED substrate than inlet port(s) as viewed from the direction perpendicular to the mounting surface of the LED substrate, and flow passage(s) which connect inlet port(s) and outlet port(s) and through interior(s) of which cooling medium flows.

18 Claims, 8 Drawing Sheets

LIGHT SOURCE UNIT AND LIGHT IRRADIATION DEVICE

TECHNICAL FIELD

The present invention relates to a light source unit and a light irradiation device, and relates in particular to a light source unit and a light irradiation device that employ LED element(s) as light source(s) to cause a workpiece to be irradiated with light.

BACKGROUND ART

In semiconductor manufacturing processes, semiconductor wafers and/or other such workpieces are subjected to various types of thermal treatments that may include film formation treatment, oxidation/diffusion treatment, reforming treatment, and annealing treatment, thermal treatment methods making use of irradiation of light which permits noncontact treatment being employed for such treatments in many cases.

The properties of LED elements characteristically change as a function of temperature such that radiance decreases with increasing temperature even where the electric power supplied thereto is held constant. For this reason, in most devices where LED elements are employed as light sources for application of heat, so as to make it possible for higher radiances to be maintained, substrates on which LED elements are mounted (LED substrates) are provided with heat sinks for air cooling and/or flow passages for water cooling.

In particular, in a light irradiation device in which a multiplicity of LED elements are employed and high output is demanded such as is the case for thermal treatment of semiconductor wafers, water-cooled cooling mechanisms which have higher heat dissipating capacities than air-cooled mechanisms are ordinarily employed. In addition, Patent Document 1, below, discloses a light irradiation device for thermal treatment in which a flow passage is formed in such fashion that liquid coolant flows in a circumferential direction as viewed from a direction perpendicular to the LED substrate mounting surface.

PRIOR ART DOCUMENTS

Patent Documents

Patent Document 1: JP-A-2013-008752

SUMMARY OF INVENTION

Problem to be Solved by Invention

It is to be expected that devices which cause semiconductor wafers employed in semiconductor manufacturing processes to be irradiated with light will be capable of causing light to be irradiated at the same intensity over the entire surface (especially the principal plane) of the workpiece so that treatment is carried out uniformly over the entire semiconductor wafer.

The present inventor(s) therefore engaged in intensive study with respect to a light irradiation device such as might be capable of causing light to be irradiated more uniformly over the entirety of a semiconductor wafer or other such workpiece, as a result of which the following problems were found to exist. The following description is given with reference to the drawings.

FIG. 12 and FIG. 13 are schematic drawings showing an exemplary LED substrate 103 mounted in a conventional light irradiation device for thermal treatment. Formed toward the interior from the LED substrate 103 is the flow passage 103c (shown in broken line in the drawing; the double-dash chain line indicating the direction in which liquid coolant flows) through which liquid coolant flows. Note that while LED elements are not shown at this FIG. 12 and this FIG. 13, LED element(s) may be mounted on the surface of the LED substrate 103 at which flow passage 103c is formed or on the surface of the LED substrate 103 opposite the side thereof at which the flow passage 103c is formed.

As shown in FIG. 12 and FIG. 13, the LED substrate 103 mounted in a conventional light irradiation device for thermal treatment is such that the flow passage 103c is formed in such fashion that liquid coolant flows in the direction indicated by the double-dash chain line from an inlet port 103p toward an outlet port 103q. Looking at these from the perspective of the overall the LED substrate 103, liquid coolant flows so as to revolve thereabout in a circumferential direction as indicated by the arrow shown in single-dash chain line.

Because the temperature of the liquid coolant gradually increases due to the fact that it absorbs the heat which is produced by the LED elements as it flows through the flow passage 103c, the amount of heat that it can absorb gradually decreases as it moves downstream (toward the outlet port 103q). In other words, with a conventional light irradiation device, the overall temperature distribution at the LED substrate 103 is such that temperature gradually increases in the circumferential direction in which the liquid coolant flows, i.e., as one proceeds in the direction of the arrow shown in single-dash chain line. In addition, because the distance of revolution toward perimeter edge portion 103e of the LED substrate 103 is greater than it is toward center 103f, the temperature difference there will be more striking.

As mentioned above, LED element radiance decreases with increasing temperature even when the electric power supplied thereto is held constant. This being the case, at the LED substrate 103 constituted as shown in FIG. 12 and FIG. 13, in the circumferential direction of the LED substrate 103, the radiance of the LED elements mounted on the LED substrate 103 will gradually decrease as one proceeds in the direction of the arrow shown in single-dash chain line. Thus, with a conventionally constituted the light irradiation device, at the principal plane of workpiece W1, irradiative nonuniformities occur in the circumferential direction, and it has not been possible to cause light to be irradiated as uniformly as had been expected.

Furthermore, with the goal of increasing the uniformity of the distribution of light with which a workpiece is irradiated, configurations have been adopted in recent years such as adoption of constitutions in which the density with which LED elements are arranged is increased at the LED substrate perimeter edge portion periphery.

FIG. 14 and FIG. 15 are sectional views showing in schematic fashion an exemplary constitution of a conventional light irradiation device 100. The light irradiation device 100 shown in FIG. 14 and FIG. 15 is provided with a chamber 101. In addition, workpiece W1 is supported at the interior of the chamber 101 by support members 104 provided within the chamber 101 in such fashion that principal plane W1a is made to oppose mounting surface 103b of the LED substrate 103.

As shown in FIG. 14, assuming that LED elements 102 are uniformly arrayed within the region at which principal plane W1a of workpiece W1 and mounting surface 103b of the LED substrate 103 are mutually opposed, there will be less mutual overlap of light toward the perimeter edge portion W1e of the workpiece W1 than there will be toward the central portion W1c thereof.

For this reason, with the goal of causing the workpiece W1 to be irradiated with light in uniform fashion over the entire surface thereof, the conventional light irradiation device 100 has been constituted such that, as shown in FIG. 15, at mounting surface 103b of the LED substrate 103, the density with which LED elements 102 causing irradiation of light toward the perimeter edge portion W1e of the workpiece W1 are arranged is greater than the density with which LED elements 102 causing irradiation of light toward the central portion W1c thereof are arranged. However, with such a constitution, as there is a tendency for the LED substrate 103 to be such that temperature toward the perimeter edge portion 103e is higher than that toward the central portion, this causes the workpiece W1 to be such that there is a dramatic decrease in the intensity of the light that is irradiated toward the perimeter edge portion W1e.

The present invention was conceived in light of such problems, it being an object thereof to provide a light source unit and a light irradiation device that will suppress irradiative nonuniformity in the light with which a workpiece is irradiated by LED elements.

Means for Solving Problem

A light source unit in accordance with the present invention causes a workpiece to be irradiated with light, and is characterized in that it includes a plurality of LED elements;

an LED substrate that has a mounting surface on which the plurality of LED elements are mounted and that includes a plurality of subdivided regions arrayed in a circumferential direction at least at an outwardmost locus as viewed from a direction perpendicular to the mounting surface; and a cooling member which is provided at a surface on a side opposite the mounting surface of the LED substrate and at which provided at each of the plurality of subdivided regions there are an inlet port for flow thereinto of cooling medium for cooling the LED elements, an outlet port that is for discharge of the cooling medium and that is disposed more toward a center of the LED substrate than the inlet port as viewed from the direction perpendicular to the mounting surface of the LED substrate, and a flow passage which connects the inlet port and the outlet port and through an interior of which the cooling medium flows.

Furthermore, the light source unit may be such that arranged at the LED substrate there are a plurality of substrate subsets at which the subdivided regions are respectively formed.

In the present specification, where it is said that the principal plane of the workpiece opposes the mounting surface of the LED substrate, this includes not only situations in which the respective surfaces are directly opposed but also situation in which these are opposed by way of intervening member(s) that permit light emitted from LED element(s) to be transmitted therethrough such as is the case where a light-transmissive window is formed at a wall of the chamber.

The LED substrate is provided with a plurality of subdivided regions that are arrayed in a circumferential direction at least at an outwardmost locus thereat. Such constitution may for example include situations in which a single LED substrate is provided with a plurality of subdivided regions exhibiting a fan-shaped appearance, situations constituted such that one or more regions is surrounded by other region(s) arrayed in circumferential direction(s) thereabout, and so forth. Furthermore, where constituted from a plurality of substrate subsets, there are situations in which the regions are constituted at each of the respective plurality of substrate subsets, these being arrayed in such fashion as to form the LED substrate. Specific examples of how these might be constituted can be found in the shapes shown in the drawings of the respective embodiments, reference to which is made in the descriptions given at the "Embodiments for Carrying Out Invention".

As a result of adoption of the foregoing constitution, cooling medium which is in a state such that the temperature thereof is low is made to flow into the respective inlet ports. In addition, cooling medium flowing from the respective inlet ports is made to flow not through the entire LED substrate but through respective flow passages corresponding to respective subdivided regions or substrate subsets. For this reason, flow passage(s) (especially where these might otherwise have been routed so as to revolve about the perimeter edge portion periphery) through which cooling medium flows are made shorter than would be the case were the flow passage(s) to cause flow of cooling medium through the entire LED substrate, and the cooling medium tends to arrive at outlet port(s) before it would reach an elevated temperature.

Furthermore, even if the cooling medium should reach an elevated temperature within a flow passage, it will no longer be the case at the perimeter edge portion periphery that cooling medium which is in a state such that the temperature thereof is high is while still in that state made to flow in such fashion as to make a full revolution about the LED substrate. In accordance with the present invention, note that water or a fluorinated inert liquid or the like may for example be employed as cooling medium.

This will make it possible to suppress differences in temperature that might otherwise occur in the circumferential direction at the mounting surface of the LED substrate, will make it possible to suppress overall nonuniformity in radiance of LED elements mounted on the LED substrate, and will make it possible to suppress irradiative nonuniformity in the light with which the substrate is irradiated.

Moreover, the longer the period of time during which an LED element is made to remain at elevated temperature the shorter will be its life. In other words, adoption of the foregoing constitution will make it possible to cause a light irradiation device to exhibit an effect whereby irradiative nonuniformity in the light with which a substrate is irradiated is suppressed, and also an effect whereby variation in the life of LED elements is reduced.

Furthermore, at the LED substrate, by adjusting the number of subdivisions and/or the size of respective substrate subsets, and by appropriately choosing the lengths of the routes taken by the cooling medium flow passages and/or the number of LED elements which are arranged thereat, it will be possible to adjust the temperature distribution of the overall the LED substrate.

Furthermore, the light source unit may be such that the flow passage is constituted so as to be directed toward the center from a location toward a perimeter edge portion as viewed from the direction perpendicular to the mounting surface of the LED substrate.

Moreover, the light source unit may be such that, as viewed from the direction perpendicular to the mounting surface of the LED substrate, the inlet port appears to overlap at least one of that or those among the LED elements which constitute an outer edge of a region in which the LED elements are arranged.

For example, where the constitution is such that the density with which LED elements are arranged is greater toward the perimeter edge portion of the LED substrate than it is toward the central portion thereof, the temperature toward the perimeter edge portion will be very much greater than the temperature toward the central portion.

The foregoing constitution might therefore be adopted, as a result of which cooling medium which is in a state such that the temperature thereof is low is made to flow thereinto by way of the inlet port(s) is first made to flow through locations toward the perimeter edge portion and is thereafter made to flow through locations toward the center as it is gradually made to absorb the heat of the LED elements. Accordingly, it will be possible to cause the cooling medium which is made to flow through flow passage(s) to absorb more heat at locations toward the perimeter edge portion than toward the center, and it will be possible to achieve a constitution such as will cause locations toward the perimeter edge portion to be subjected to cooling in more prioritized fashion.

Here, the expression "so as to be directed toward the center from a location toward a perimeter edge portion" includes not only constitutions in which the center is gradually approached as advancement is made but also constitutions such as those in which approach is made toward the center in step-like fashion such as when movement in a circumferential direction and movement which is in a radial direction and which is directed toward the center is carried out in repeated and alternating fashion.

The light source unit may be such that, as viewed from the direction perpendicular to the mounting surface of the LED substrate, the plurality of substrate subsets are constituted so as to have rotational symmetry about the center of the LED substrate.

Rotational symmetry refers to a constitution which is such that a rotation of (360°/n) about the center of the mounting surface produces a match, where n is an integer not less than 2.

Moreover, the light source unit may be such that, as viewed so as to face the mounting surface of the LED substrate, the plurality of substrate subsets are constituted so as to have point symmetry about the center of the LED substrate.

Point symmetry refers to a constitution which is such that a rotation of 180° about the center of the mounting surface produces a match, and is equivalent to the situation that exists when n is 2 at the foregoing rotational symmetry.

As a result of adoption of the foregoing constitution, cooling medium which has separately been made to flow into the respective inlet ports is made to flow through flow passages at the respective cooling members. For this reason, in the circumferential direction at the mounting surface of the LED substrate, at least at the perimeter edge portion periphery, as cooling medium is supplied thereto via a plurality of respective flow passages, there will not be occurrence of a temperature gradient of the sort in which temperature might otherwise have been made to gradually increase were this have been made to describe the locus of a full revolution about the center. Accordingly, the overall temperature distribution of the LED elements mounted on the mounting surface of the LED substrate will be more uniform.

Where it is said in the present specification that "rotation produces a match", note that this refers not only to the situation in which there is a perfect match before and after rotation but means that there is an overlap of not less than 95% in the area of the member(s) or region(s) in question as measured relative to that which existed before rotation when the situations obtained before and after rotation as viewed from a prescribed direction are made to lie one atop the other. Describing this in terms of an example employing substrate subsets, this means that when these are rotated about the center of the LED substrate, the situations obtained before and after rotation are such that the substrate subsets after rotation overlap the area of the substrate subsets before rotation by not less than 95% as viewed from a direction perpendicular to the mounting surface.

The light source unit may be such that, as viewed from the direction perpendicular to the mounting surface of the LED substrate, the flow passages are constituted so as to have point symmetry about the center of the LED substrate.

As a result of adoption of the foregoing constitution, cooling medium which has been made to flow into the respective inlet ports is made to absorb heat as it flows through flow passage(s) formed so as to have point symmetry. For this reason, in the circumferential direction at the mounting surface of the LED substrate, there will not be occurrence of a temperature gradient of the sort in which temperature might otherwise have been made to gradually increase were this have been made to describe the locus of a full revolution about the center. Accordingly, the overall temperature distribution of the LED elements mounted on the mounting surface of the LED substrate will be more uniform.

The foregoing light source unit may be such that a primary component of a material of the LED substrate is aluminum nitride or silicon nitride.

The term "primary component" as used in the present specification refers to the material that is present therein in the highest fractional amount.

As a result of adoption of the foregoing constitution, it will be possible to cause heat produced by LED elements to propagate efficiently to cooling medium that flows within flow passage(s).

The foregoing light source unit may be such that formed at the mounting surface of the LED substrate are a first region, and a second region which is more toward the center of the LED substrate than the first region and at which a density with which the LED elements are arranged is less than that at the first region.

As a result of adoption of the foregoing constitution, differences between the intensity of the light which irradiates locations toward the perimeter edge portion of the workpiece and the intensity of the light which irradiates locations toward the center thereof will be reduced, and the intensity distribution of the light with which the workpiece is irradiated will be made more uniform. Note that formed at the mounting surface of the LED substrate there may be other region(s) respectively more toward the perimeter edge portion than the first region, more toward the center than the second region, and between the first region and the second region, at which the density with which LED elements are arranged is different from those at the first region and the second region.

A light irradiation device in accordance with the present invention is characterized in that it includes;

a chamber that contains the workpiece;

a support member that supports the workpiece within the chamber; and the foregoing light source unit that causes light directed toward the workpiece to be irradiated therefrom.

The light irradiation device may be such that the light source unit is arranged outside the chamber.

While this will vary depending on the thermal treatment operation, during the time that thermal treatment is being carried out, because there are situations in which the workpiece may be heated to as high as several hundred degrees, the space at the interior of the chamber may reach an extremely high temperature. This being the case, if LED elements are arranged within the chamber, there is a possibility that the LED elements will suffer damage due to the heat.

By therefore adopting the foregoing constitution, it will be possible to avoid the risk that the LED elements will suffer damage during thermal treatment.

BENEFIT OF INVENTION

The present invention permits achievement of a light source unit and a light irradiation device that will suppress irradiative nonuniformity in the light with which a workpiece is irradiated by LED elements.

EMBODIMENTS FOR CARRYING OUT INVENTION

Figure 1:
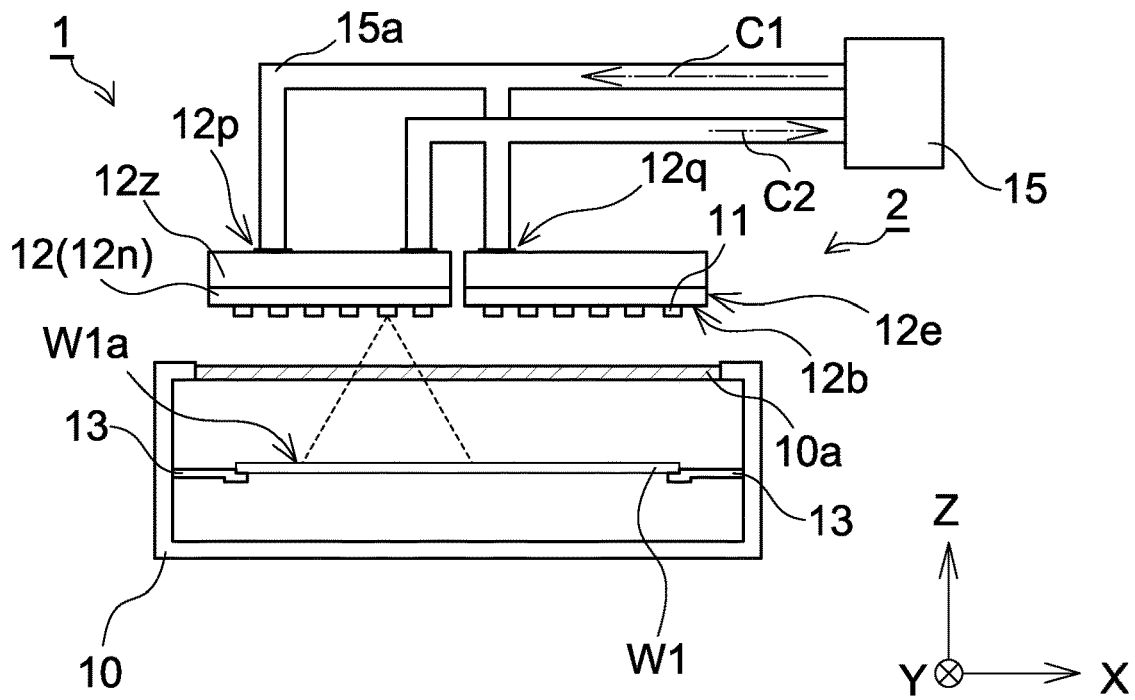
FIG. 1 is a schematic sectional view of the constitution of an embodiment of a light irradiation device as seen in the Y direction.

Below, light irradiation devices in accordance with the present invention are described with reference to the drawings. As the following respective drawings related to light irradiation devices are all mere schematic representations thereof, note that the dimensional ratios and numbers of items shown in the drawings are not necessarily consistent with actual dimensional ratios and numbers of items.

First Embodiment

FIG. 1 is a schematic sectional view of the constitution of an embodiment of a light irradiation device 1 as seen in the Y direction. As shown in FIG. 1, the light irradiation device 1 of the first embodiment is provided with a light source unit 2, a chamber 10 which contains workpiece W1, and a supply mechanism 15; the light source unit 2 is provided with a plurality of LED elements 11, and an LED substrate 12 on which LED elements 11 are mounted.

At the description which follows, as shown in FIG. 1, description will be given with reference to a Z direction which is in the direction in which the LED substrate 12 and workpiece W1 are mutually opposed; an X direction which is in the direction in which a pair of support members 13, described below, are mutually opposed; and a Y direction which is in a direction perpendicular to the X direction and the Z direction.

Furthermore, similarly, in referring to directions below, where a distinction is to be made between positive and negative senses of a direction, this will be indicated by appending a plus or minus sign thereto as in the "+Z direction" and the "−Z direction"; where no distinction is to be made between positive and negative senses of a direction, reference will be made to simply the "Z direction".

As shown in FIG. 1, the chamber 10 is provided with a pair of support members 13 that support workpiece W1 at a location inward therefrom. Support members 13 support workpiece W1 in such fashion that the principal plane W1a of the workpiece W1 is arranged in the XY plane.

Note that it is sufficient that support of workpiece W1 by support member(s) 13 be such as will cause the principal plane W1a thereof to be arranged in the XY plane, for example, support members 13 may be provided with a plurality of pin-like projections such that workpiece W1 is supported in point-like fashion by those projections. Here, principal plane W1a is where circuit elements, wiring, and so forth are formed, being the plane from which the light emitted by LED elements 11 is irradiated.

Furthermore, the chamber 10 is provided, at a wall toward the +Z side thereof, with light-transmissive window 10a, which is for capturing, at a location inward therefrom, light emitted from LED elements 11, and through which the light emitted from LED elements 11 passes. As shown in FIG. 1, light-transmissive window 10a with which the chamber 10 is provided is constituted so as to be opposed to principal plane W1a of workpiece W1 which is supported by support members 13. In other words, light emitted from LED elements 11 irradiates principal plane W1a of workpiece W1 by way of light-transmissive window 10a.

Note that the LED substrate 12 may be arranged within the chamber 10, and the chamber 10 may not be provided with light-transmissive window 10a. Furthermore, any desired shape may be employed for the shape of the chamber 10 as seen in the Z direction might, it being possible, for example, for this to be circular, elliptical, polygonal, or the like.

Figure 3:
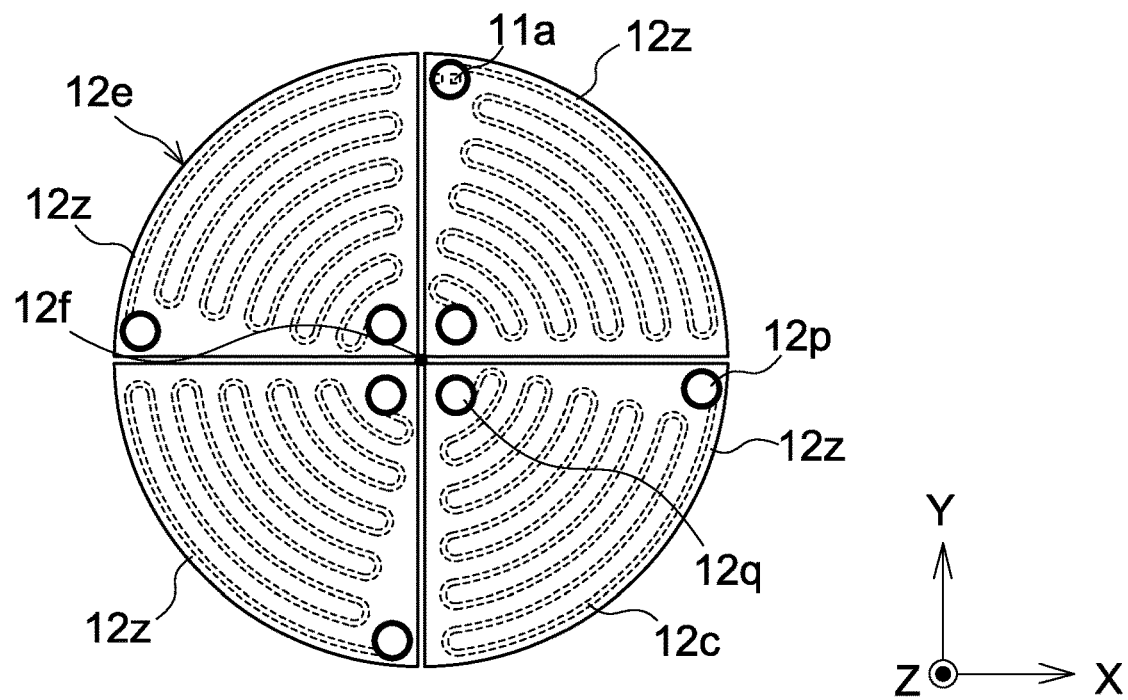
FIG. 3 is a view of cooling members as seen from a location at the +Z side thereof.

As shown in FIG. 1, the supply mechanism 15 is connected by tubular plumbing 15a to outlet ports 12q and inlet ports 12p of cooling members 12z provided at surfaces on the +Z side of the LED substrate 12. As indicated by the arrow shown in single-dash chain line at FIG. 1, the supply mechanism 15 causes liquid coolant C1 to flow into inlet ports 12p, and receives liquid coolant C2 that has been made to flow through the flow passages 12c formed in cooling members 12z to be discharged from outlet ports 12q. Note that the flow passages 12c are shown in FIG. 3, described below.

From the standpoint of heat dissipating efficiency, it is preferred that cooling members 12z be members fabricated such that the primary component thereof is a material such as aluminum or copper having high thermal conductivity. While cooling members 12z are shown in FIG. 1 as being planar members of the same thickness as the LED substrate 12, depending on heat dissipating efficiency, the constitution in terms of arrangement of LED elements 11, and so forth, the cooling members 12z may be ring-shaped member(s), block-shaped member(s), or any other such desired shape(s).

Note that while the first embodiment is described in terms of a constitution in which cooling is carried out by causing water coolant serving as cooling medium to flow through flow passages 12c of cooling members 12z, it is also possible to employ a cooling medium other than water, such as, for example, a fluorinated inert liquid or the like.

Furthermore, whereas the first embodiment of the light irradiation device 1 is constituted such that liquid coolant C2 discharged from outlet ports 12q is made to return to supply mechanism 15, however, the liquid coolant C2 may be discharged to the exterior of the light irradiation device 1.

Figure 2:
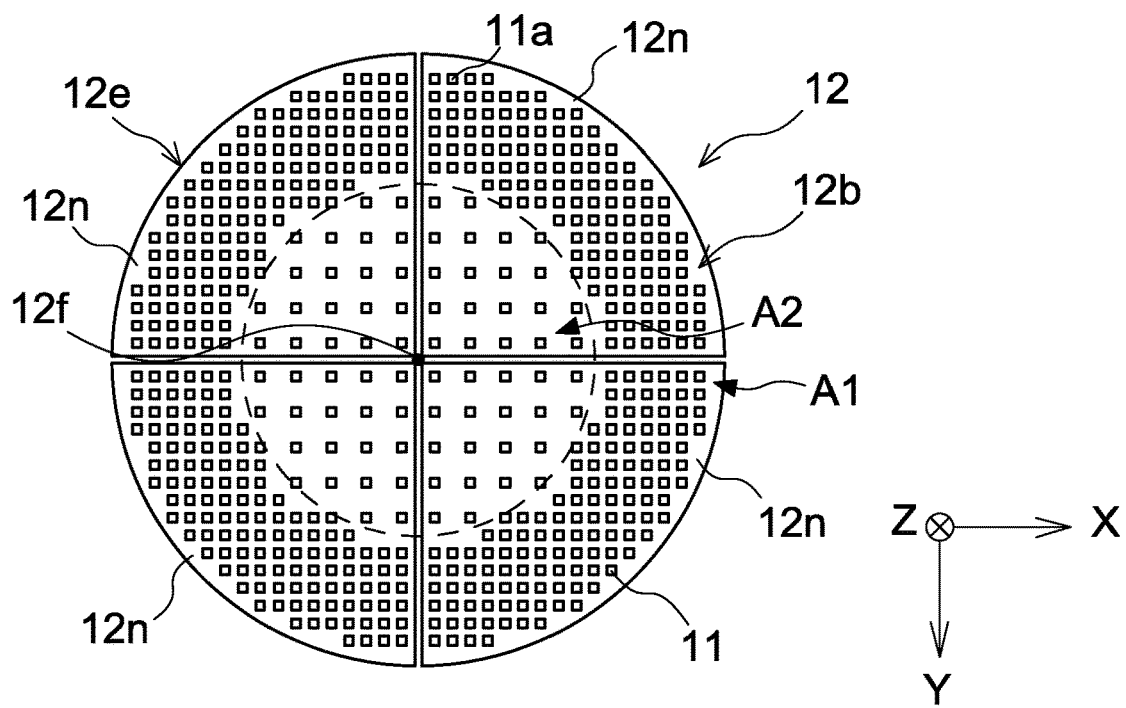
FIG. 2 is a schematic view of an LED substrate as seen from a location at the −Z side thereof.

FIG. 2 is a schematic view of the LED substrate 12 as seen from a location at the −Z side thereof. As shown in FIG. 2, as viewed in the Z direction, the LED substrate 12 is such that substrate subsets 12n are arrayed in the circumferential direction in such fashion as to be point symmetric about center 12f of the LED substrate 12. A plurality of LED elements 11 are arranged in array-like fashion on mounting surface 12b of the LED substrate 12 which is arranged so as to oppose principal plane W1a of workpiece W1 which is supported by support members 13.

Figure 14:
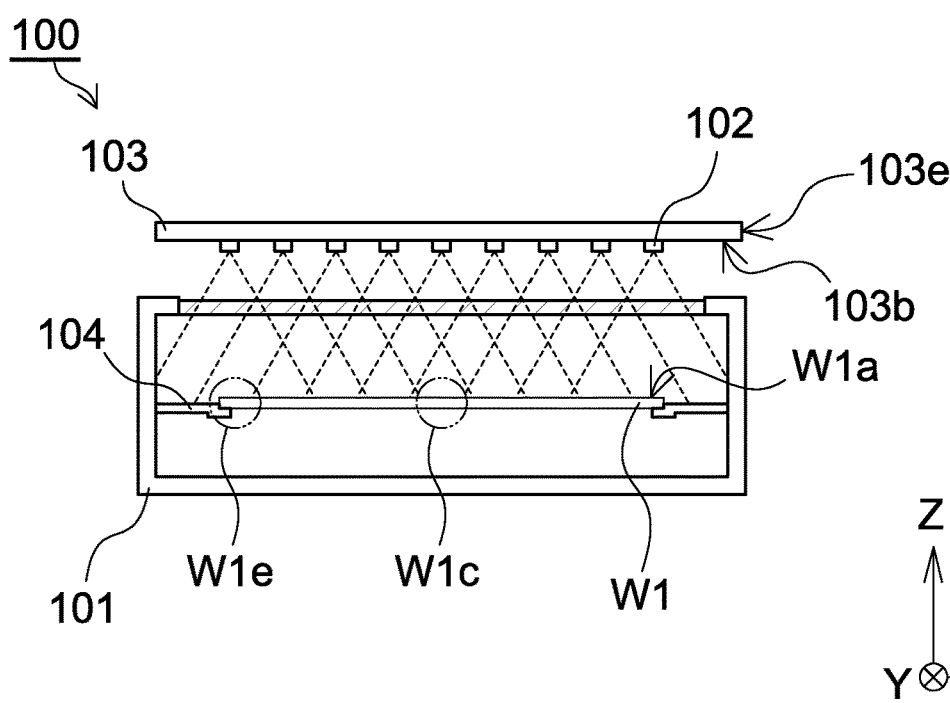
FIG. 14 is a sectional view showing in schematic fashion an exemplary constitution of a conventional light irradiation device.
Figure 15:
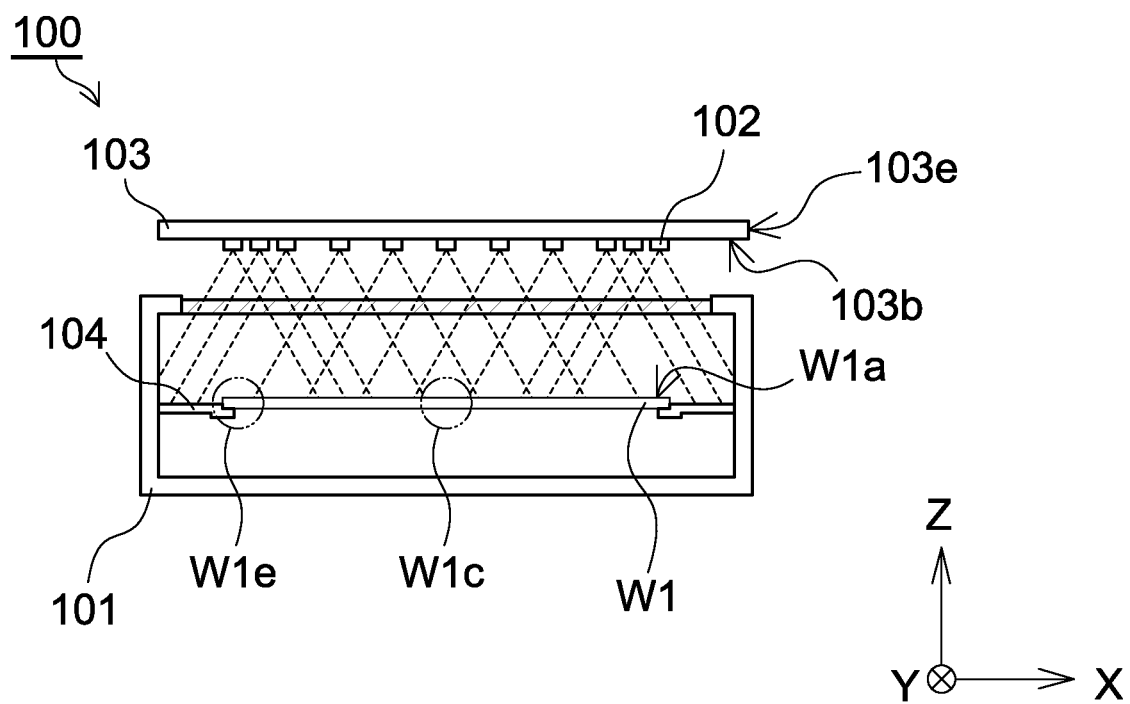
FIG. 15 is a sectional view showing in schematic fashion an exemplary constitution of a conventional light irradiation device.

Furthermore, as mentioned above with reference to FIG. 14 and FIG. 15, with the goal of increasing the uniformity of the distribution of light with which workpiece W1 is irradiated, the plurality of LED elements 11 are arranged in such fashion that the density with which these are arranged is greater at the periphery of perimeter edge portion 12e of the LED substrate 12. In other words, formed thereat are a first region A1 which is toward perimeter edge portion 12e, and a second region A2 which is toward center 12f and at which the density with which LED elements 11 are arranged is less than that at first region A1.

From the standpoints of the heat dissipating characteristics of LED elements 11 and ensuring the uniformity of the light with which workpiece W1 is irradiated, it is preferred that the plurality of LED elements 11 mounted on mounting surface 12b of the LED substrate 12 be arranged such that the distances separating them be 1.0 mm to 5.0 mm, and it is more preferred that they be arranged such that the distances separating them be 1.5 mm to 3.0 mm.

FIG. 3 is a view of cooling members 12z as seen from a location at the +Z side thereof; and while in reality they would not actually be visible, exemplary flow passages 12c which are formed toward the interior from cooling members 12z and through which liquid coolant C1 flows, and a portion of LED elements 11a forming the outer edge of a region in which LED elements 11 are arranged, are shown in broken line. As shown in FIG. 2 and FIG. 3, the LED substrate 12 and cooling members 12z exhibit identical shapes. Cooling members 12z are arranged so as to respectively correspond to the LED substrate 12 which is made up of four substrate subsets 12n, the shapes of flow passages 12c all appearing to be the same when cooling members 12z are viewed in the Z direction.

As the primary component of the material for the LED substrate 12 on which LED elements 11 are mounted, which is an insulated material metal oxides, metal nitrides, and other such ceramics may be employed, which has a high thermal conductivity aluminum nitride and silicon nitride being particularly preferred therefor.

As shown in FIG. 3, the flow passage 12c is directed toward center 12f from a location toward perimeter edge portion 12e in such fashion as to connect the inlet port 12p and the outlet port 12q which is provided toward center 12f of the LED substrate 12 from the inlet port 12p. Furthermore, as seen when all of cooling members 12z are viewed collectively, the flow passages 12c are constituted so as to have point symmetry with respect to center 12f of the LED substrate 12. In addition, inlet ports 12p are formed in such fashion that, as viewed in the Z direction, they appear to overlap those LED elements 11a which constitute the outer edge of the region in which LED elements 11 are arranged as shown in FIG. 2.

Whereas the flow passage 12c is formed so as to be directed toward center 12f from a location toward perimeter edge portion 12e, however, the flow passage 12c may be made to include portion(s) routed so as to be directed toward perimeter edge portion 12e from location(s) toward center 12f. Furthermore, as mentioned above, the flow passage 12c may be constituted by tubular member(s) installed on the surface of the LED substrate 12 which is opposite the side thereof on which LED elements 11 are mounted.

As a result of adoption of the foregoing constitution, liquid coolant C1, which is in a state such that the temperature thereof is low, is made to flow into respective inlet ports 12p from supply mechanism 15. In addition, liquid coolant C1 which flows thereinto by way of respective inlet ports 12p flows not through the entire LED substrate 12 but through the flow passages 12c at the respective substrate subsets 12n into which the entirety is divided. For this reason, as the flow passages 12c through which liquid coolant C1 flows are shorter than would be the case were these such as to cause flow through a single common cooling member 12z, liquid coolant C1 tends to arrive at outlet ports 12q before it would reach an elevated temperature.

Furthermore, as liquid coolant C1 is made to flow from supply mechanism 15 into respective inlet ports 12p, the LED substrate 12 is cooled in point symmetric fashion. For this reason, in the circumferential direction of the LED substrate 12, there is no occurrence of a temperature gradient of the sort in which temperature might otherwise have been made to gradually increase were this have been made to describe the locus of a full revolution about the center 12f of the LED substrate 12. Accordingly, overall nonuniformity in the temperature of the LED substrate 12 is suppressed, overall uniformity in the radiance of LED elements 11 is improved, and irradiative nonuniformity in the light with which workpiece W1 is irradiated is suppressed.

Moreover, as shown in FIG. 3, as a result of adoption of a constitution in which liquid coolant C1 is made to flow so as to be directed toward center 12f from locations toward perimeter edge portion 12e, liquid coolant C1 which is in a state such that the temperature thereof is low is able to absorb a greater amount of heat at locations toward perimeter edge portion 12e which is toward the upstream side of flow passages 12c. As a result, locations toward perimeter edge portion 12e of the LED substrate 12 are subjected to prioritized cooling, differences in temperature between locations toward center 12f and locations toward perimeter edge portion 12e are reduced, and uniformity in the overall temperature distribution of the LED substrate 12 is further improved.

While the LED substrate 12 of the light irradiation device 1 in accordance with the first embodiment is constituted from four substrate subsets 12n, however, the LED substrate 12 may be constituted from two substrate subsets 12n, or to an embodiment in which this is constituted from six or more substrate subsets 12n.

Furthermore, the LED substrate 12 and the respective substrate subsets 12n may be shaped as seen in the Z direction are hexagonal, octagonal, or other such polygonal shape.

To reduce the size of the overall device, the light irradiation device 1 may be provided with plumbing in the form of a plate in which passages for distribution of liquid are formed instead of tubular plumbing 15a. Because plumbing in the form of a plate would not require as much space for arrangement thereof as would tubular plumbing 15a, employment thereof would make it possible to reduce the overall size of the light irradiation device 1.

Furthermore, the flow passage 12c may be formed so as to have portion(s) at which flow is directed toward perimeter edge portion 12e from location(s) toward center 12f.

Moreover, the inlet port 12p may be such that, as viewed in the Z direction, it does not appear to overlap those LED elements 11a which constitute the outer edge of the region in which LED elements 11 are arranged.

Second Embodiment

The constitution of a second embodiment of the light irradiation device 1 in accordance with the present invention will be described with emphasis on the differences from the first embodiment.

Figure 4:
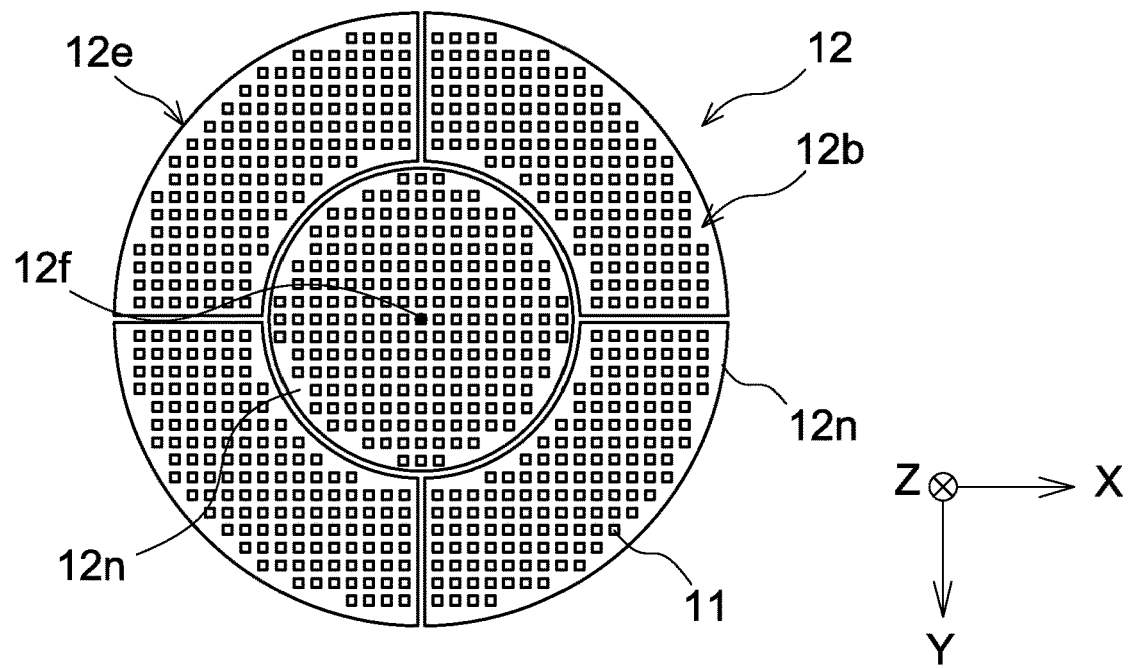
FIG. 4 is a schematic view of an LED substrate in an embodiment of a light irradiation device as seen from a location at the −Z side thereof.

FIG. 4 is a schematic view of the LED substrate 12 in an embodiment of the light irradiation device 1 as seen from a location at the −Z side thereof. As shown in FIG. 4, the light irradiation device 1 of the second embodiment is such that the LED substrate 12 is constituted from substrate subset 12n which exhibits the shape of a single circle, and four substrate subsets 12n constituted so as to be arrayed in the circumferential direction so as to surround the substrate subset 12n. When viewed in its entirety, the LED substrate 12 has point symmetry with respect to center 12f.

At the second embodiment, as shown in FIG. 4, a plurality of LED elements 11 are arranged in such fashion that the density with which they are arranged is approximately the same at each of the substrate subsets 12n.

Figure 5:
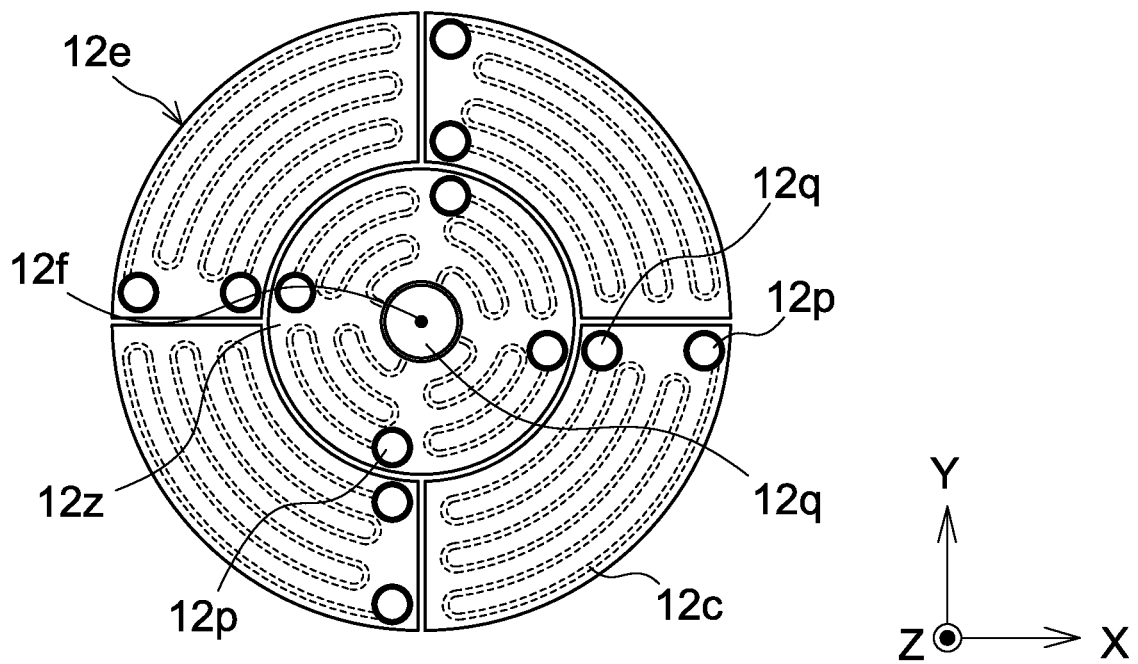
FIG. 5 is a view of cooling members as seen from a location at the +Z side thereof.

FIG. 5 is a view of cooling members 12z as seen from a location at the +Z side thereof; and, in similar fashion as at FIG. 3, while in reality they would not actually be visible, exemplary the flow passages 12c which are formed toward the interior and through which liquid coolant C1 (see FIG. 1) flows are shown in broken line.

Below, description of flow passage 12c for liquid coolant C1 at the second embodiment will be given in terms of the example of cooling member 12z which is provided at substrate subset 12n which corresponds to a portion thereof. At the LED substrate 12 of the second embodiment, liquid coolant C1 is made to flow from supply mechanism 15 into the respective inlet ports 12p of the four substrate subsets 12n which are arranged at the outside circumference thereof. In addition, liquid coolant C1 flows through flow passages 12c of substrate subsets 12n at the outside circumference thereof.

Liquid coolant C1 that has flowed through flow passages 12c of substrate subsets 12n at the outside circumference thereof is discharged from outlet ports 12q. Liquid coolant C1 that has been discharged from outlet ports 12q is made to flow into the inlet port 12p of the central substrate subset 12n by way of tubular plumbing (see FIG. 1).

The central substrate subset 12n is provided with one outlet port 12q for the four inlet ports 12p. Liquid coolant C1 which flows into the respective inlet ports 12p of the central substrate subset 12n flows through respective flow passages 12c and comes together at the outlet port 12q where it is discharged as liquid coolant C2 (not shown).

Whereas at FIG. 5 the outlet port 12q is constituted such that it is larger than inlet ports 12p so as to allow liquid coolant C1 which flows thereinto from respective inlet ports 12p to all be discharged together by way of a single outlet port 12q, however, the inlet ports 12p and the outlet port 12q may be configured in any size.

Thus, liquid coolant C1 flows into the respective substrate subsets 12n by way of inlet ports 12p, is made to flow through flow passages 12c of the central substrate subsets 12n, and is discharged as liquid coolant C2 by way of the outlet port 12q.

Here, the electric power supplied thereto may be controlled so as to cause the respective substrate subsets 12n to be such that radiance of LED element(s) 11 mounted on substrate subset(s) 12n toward center 12f is less than radiance of LED element(s) 11 mounted on substrate subset(s) 12n toward perimeter edge portion 12e.

By carrying out control in such fashion, it will be possible without adjusting the density with which LED elements 11 are arranged to suppress occurrence of a difference in intensity of the light which irradiates locations toward perimeter edge portion W1e versus that which irradiates locations toward central portion W1c at principal plane W1a of workpiece W1 such as was described above with reference to FIG. 15.

However, where the aforementioned control of the electric power supplied thereto is carried out, because the electric power which is supplied to LED element(s) 11 arranged at substrate subset(s) 12n toward perimeter edge portion 12e will be greater than that which is supplied to LED element(s) 11 arranged at substrate subset(s) 12n toward center 12f, locations on the LED substrate 12 toward perimeter edge portion 12e will be higher in temperature.

As shown in FIG. 5, as a result of adoption of a constitution in which liquid coolant C1 is made to flow so as to be directed toward center 12f from locations toward perimeter edge portion 12e, liquid coolant C1 which is in a state such that the temperature thereof is low is able to absorb a greater amount of heat at locations toward perimeter edge portion 12e which is toward the upstream side of the flow passages 12c. This being the case, locations toward perimeter edge portion 12e of the LED substrate 12 are subjected to prioritized cooling, differences in temperature between locations toward center 12f and locations toward perimeter edge portion 12e are reduced, and uniformity in the overall temperature distribution of the LED substrate 12 is further improved.

Moreover, the liquid coolant C1 may be made to flow directly into inlet ports 12$p$ of central substrate subset 12$n$ from the supply mechanism 15, and liquid coolant C2 may be discharged from outlet ports 12$q$ at all of the substrate subsets 12$n$.

Furthermore, the LED substrate 12 may be such that the central substrate subset 12$n$ is eliminated, and a plurality of substrate subsets 12$n$ which form perimeter edge portion 12$e$ may be constituted in annular fashion. For example, by causing the central region of the LED substrate 12 to be provided with a hole, this will make it possible for a radiation thermometer to be provided such as will permit observation of the surface temperature of workpiece W1 by way of the hole. Hole(s) for radiation thermometric observation may be provided at any among the plurality of substrate subsets 12$n$.

Third Embodiment

The constitution of a third embodiment of the light irradiation device 1 in accordance with the present invention will be described with emphasis on the differences from the first embodiment and the second embodiment.

Figure 6:
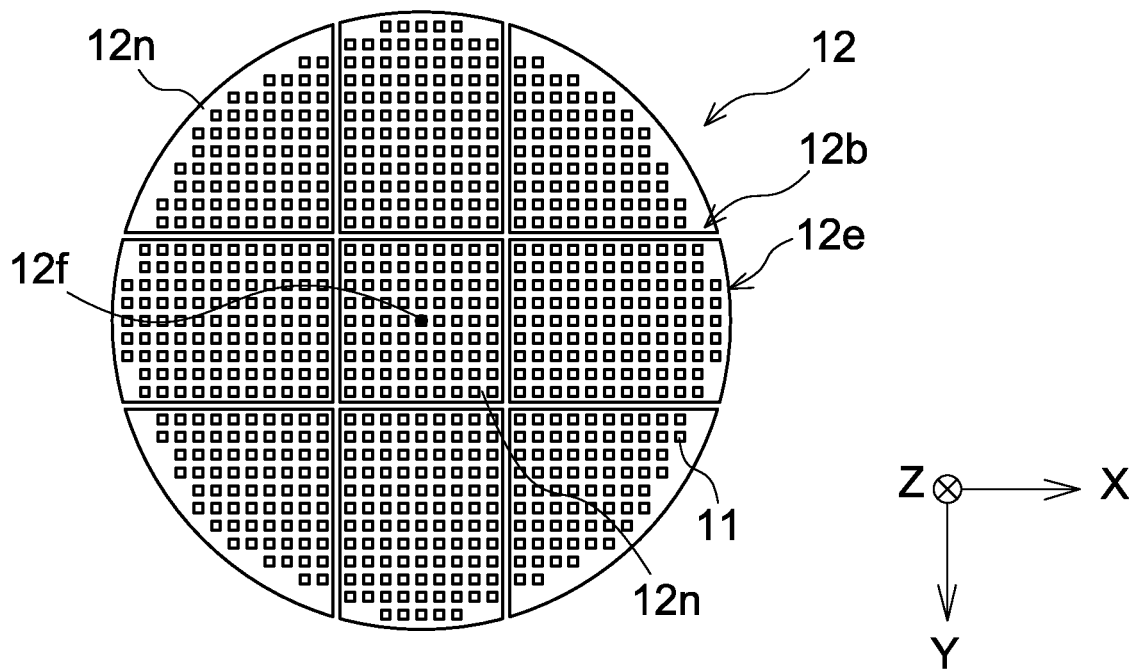
FIG. 6 is a schematic view of an LED substrate in an embodiment of a light irradiation device as seen from a location at the −Z side thereof.

FIG. 6 is a schematic view of the LED substrate 12 in an embodiment of the light irradiation device 1 as seen from a location at the −Z side thereof. As shown in FIG. 6, light irradiation device 1 of the third embodiment is such that the LED substrate 12 is constituted from a square-shaped substrate subset 12$n$, and eight substrate subsets 12$n$ arrayed in the circumferential direction so as to surround the square-shaped substrate subset 12$n$.

The LED substrate 12 of the third embodiment includes three types of shapes, and while the shapes of the respective flow passages 12$c$ are different, when viewed from the perspective of the overall the LED substrate 12 substrate subsets 12$n$ and the flow passages 12$c$ have point symmetry with respect to center 12$f$.

Figure 7:
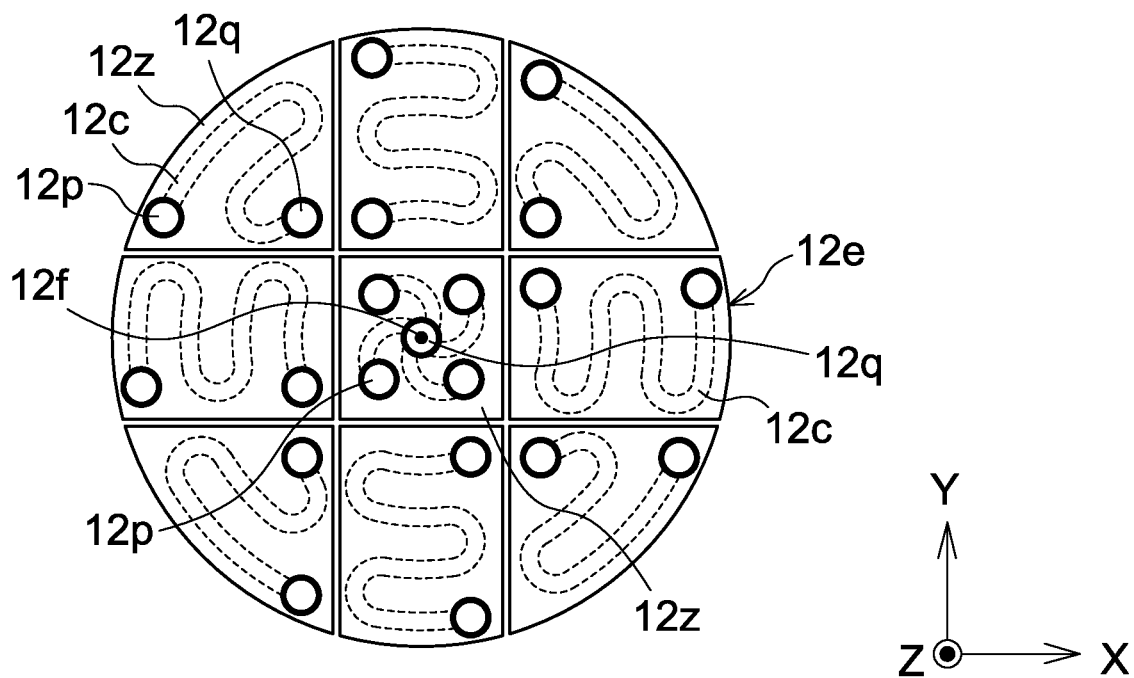
FIG. 7 is a view of cooling members as seen from a location at the +Z side thereof.

FIG. 7 is a view of cooling members 12$z$ as seen from a location at the +Z side thereof; and, in similar fashion as at FIG. 3, while in reality they would not actually be visible, the exemplary flow passages 12$c$ which are formed toward the interior and through which liquid coolant C1 flows are shown in broken line.

Below, description of the flow passage 12$c$ for liquid coolant C1 at the third embodiment will be given in terms of the example of the substrate subset 12$n$ which corresponds to a portion thereof. The third embodiment is such that liquid coolant C1 respectively flows from the supply mechanism 15 into inlet ports 12$p$ of cooling members 12$z$ provided at the eight substrate subsets 12$n$ arranged at the outside circumference. In addition, liquid coolant C1 flows through the flow passages 12$c$ of cooling members 12$z$ provided at substrate subsets 12$n$ at the outside circumference thereof.

Liquid coolant C1 that has flowed through the flow passages 12$c$ of cooling members 12$z$ at the outside circumference thereof is discharged from outlet ports 12$q$. Liquid coolant C1 that has been discharged from outlet ports 12$q$ is made to flow into inlet ports 12$p$ at a cooling member 12$z$ provided at the central substrate subset 12$n$ by way of tubular plumbing (see FIG. 1).

Here, the third embodiment is constituted such that whereas there are eight outlet ports 12$q$ at the cooling members 12$z$ at the outside circumference, there are four inlet ports 12$p$ at the central cooling member 12$z$. In this regard, adjustment in terms of combination or bifurcation of liquid coolant C1 is accomplished by means of the tubular plumbing that connects inlet ports 12$p$ at the central cooling member 12$z$ with outlet ports 12$q$ at the cooling members 12$z$ at the outside circumference.

Liquid coolant C1 that has flowed into inlet ports 12$p$ at the central cooling member 12$z$ is made to flow through the flow passages 12$c$ of the central cooling member 12$z$, and is discharged from an outlet port 12$q$ as liquid coolant C2.

Thus, liquid coolant C1 flows into the respective cooling members 12$z$ by way of inlet ports 12$p$, is made to flow through flow passages 12$c$, and is discharged as liquid coolant C2 by way of the outlet port 12$q$.

Note that the liquid coolant C1 may be made to flow directly into inlet ports 12$p$ of the central cooling member 12$z$ from the supply mechanism 15, and the liquid coolant C2 may be discharged from outlet ports 12$q$ at all of the cooling members 12$z$.

Other Embodiments

Below, description is given with respect to other embodiments.

Figure 8:
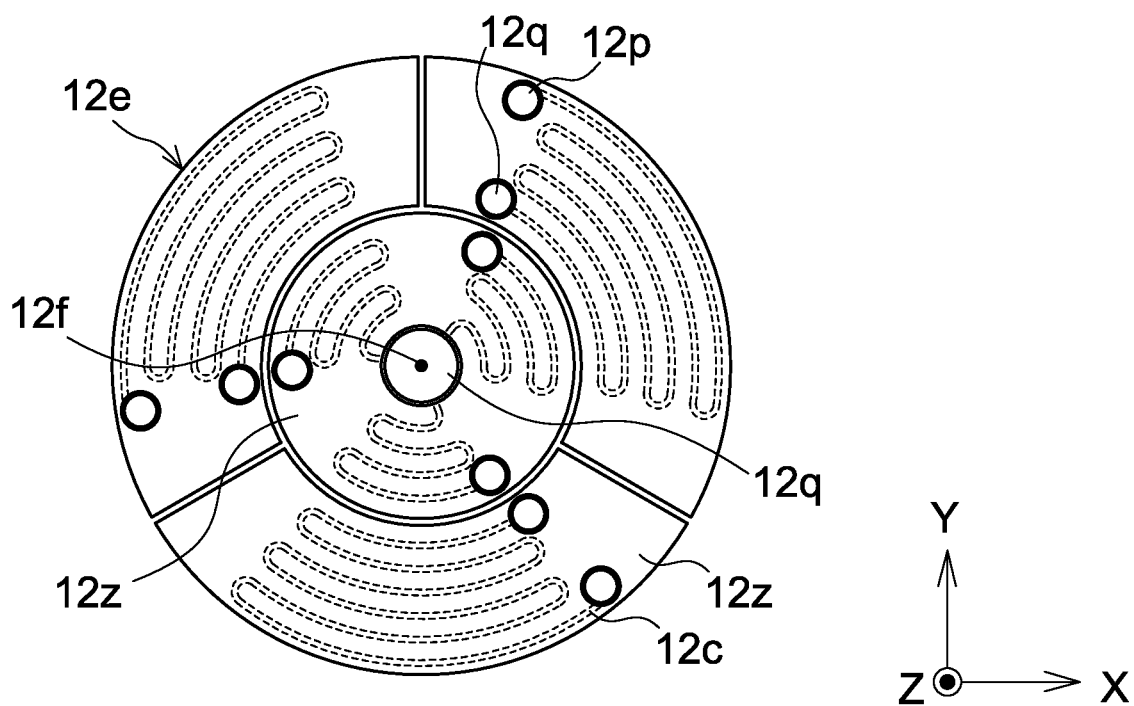
FIG. 8 is a schematic view of cooling members in another embodiment of a light irradiation device as seen from a location at the +Z side thereof.
Figure 9:
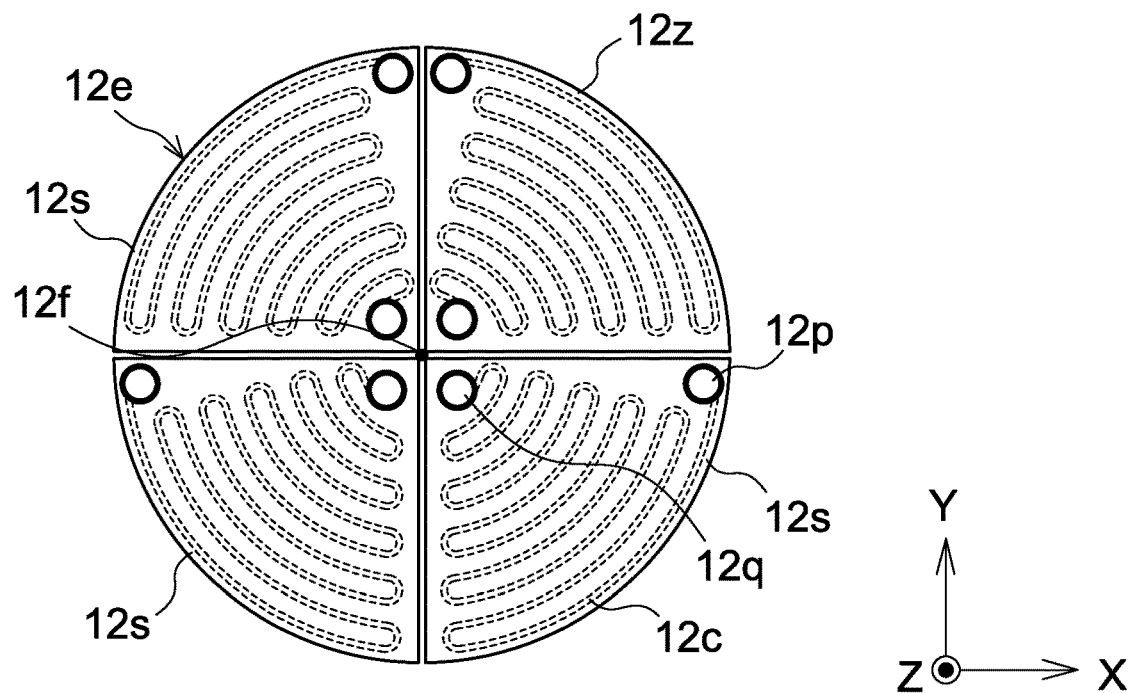
FIG. 9 is a schematic view of cooling members in another embodiment of a light irradiation device as seen from a location at the +Z side thereof.

(1) FIG. 8 and FIG. 9 are schematic views of cooling members 12$z$ of the light irradiation devices 1 in other embodiments as seen from a location at the +Z side thereof; and, in similar fashion as at FIG. 3, while in reality they would not actually be visible, the exemplary flow passages 12$c$ which are formed toward the interior and through which liquid coolant C1 flows are shown in broken line. As shown in FIG. 8, as viewed in the Z direction, substrate subsets 12$n$ which make up the LED substrate 12 may be not such that the LED substrate 12 overall is point symmetric but may be such that they match the arrangement obtained when rotated 120° (360°/3) about center 12$f$ of the LED substrate 12, which is to say that they have rotational symmetry with respect thereto.

Note that whereas an example of a constitution made up of three substrate subsets 12$n$ is shown at FIG. 8, the LED substrate 12 may be constituted such that it is made up of four or more substrate subsets 12$n$. Furthermore, the respective substrate subsets 12$n$ that form perimeter edge portion 12$e$ may not be of the same shape, such as was the case with the constitution of the third embodiment shown in FIG. 6 and FIG. 7.

Furthermore, as shown in FIG. 9, at the overall the LED substrate 12, taking center 12$f$ of the LED substrate 12 to be the origin, the flow passages 12$c$ may be constituted so as to have line symmetry about the Y axis, and may be constituted so as not to have point symmetry or rotational symmetry about center 12$f$.

Figure 10:
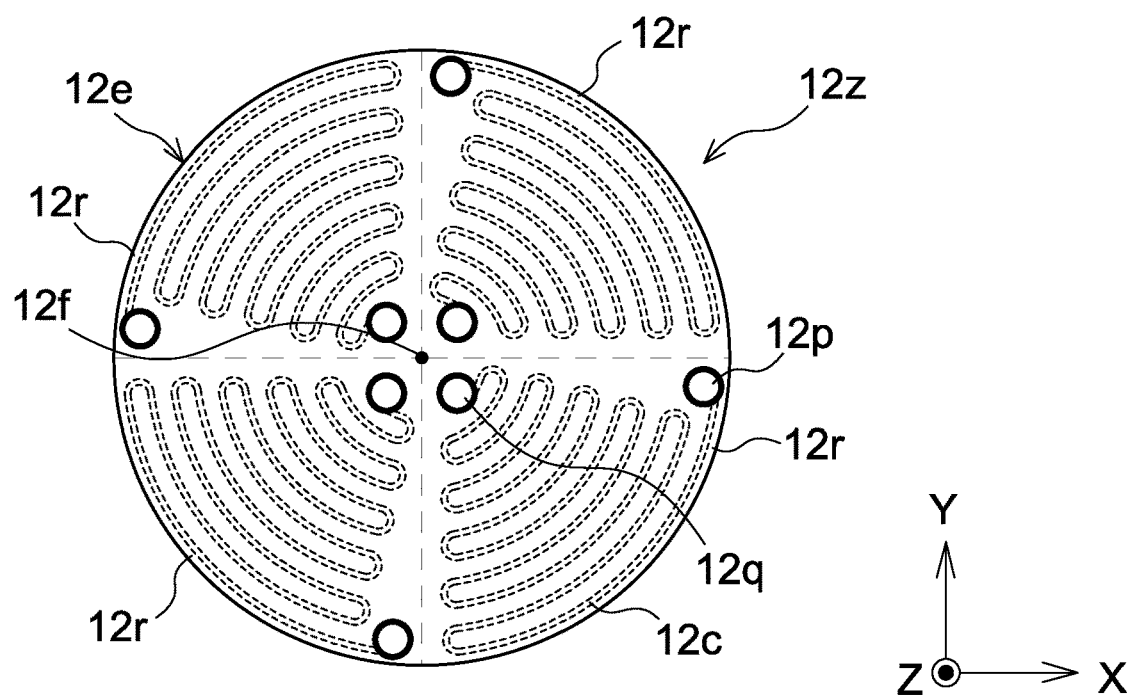
FIG. 10 is a schematic view of cooling members in another embodiment of a light irradiation device as seen from a location at the +Z side thereof.
Figure 11:
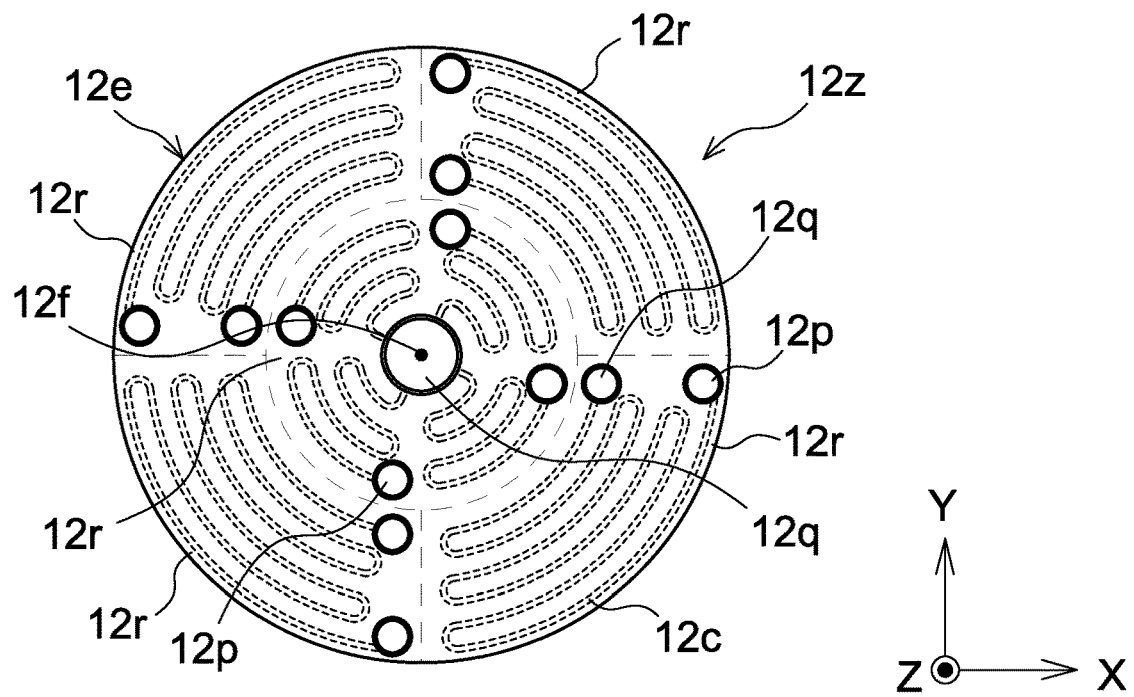
FIG. 11 is a schematic view of cooling members in another embodiment of a light irradiation device as seen from a location at the +Z side thereof.
Figure 12:
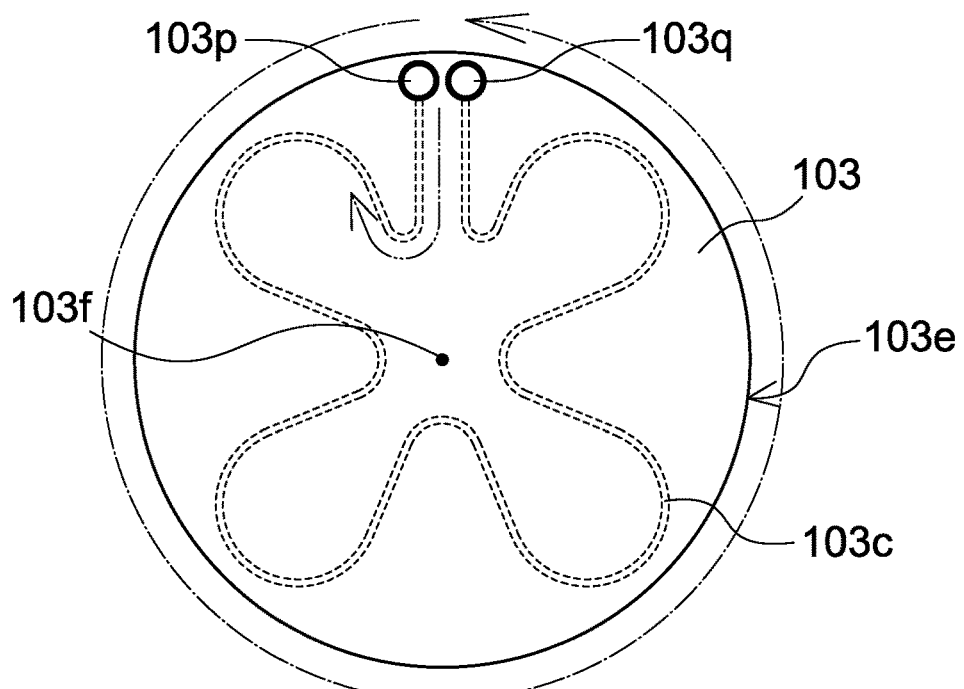
FIG. 12 is a schematic drawing showing exemplary LED substrates mounted in a conventional light irradiation device for thermal treatment.
Figure 13:
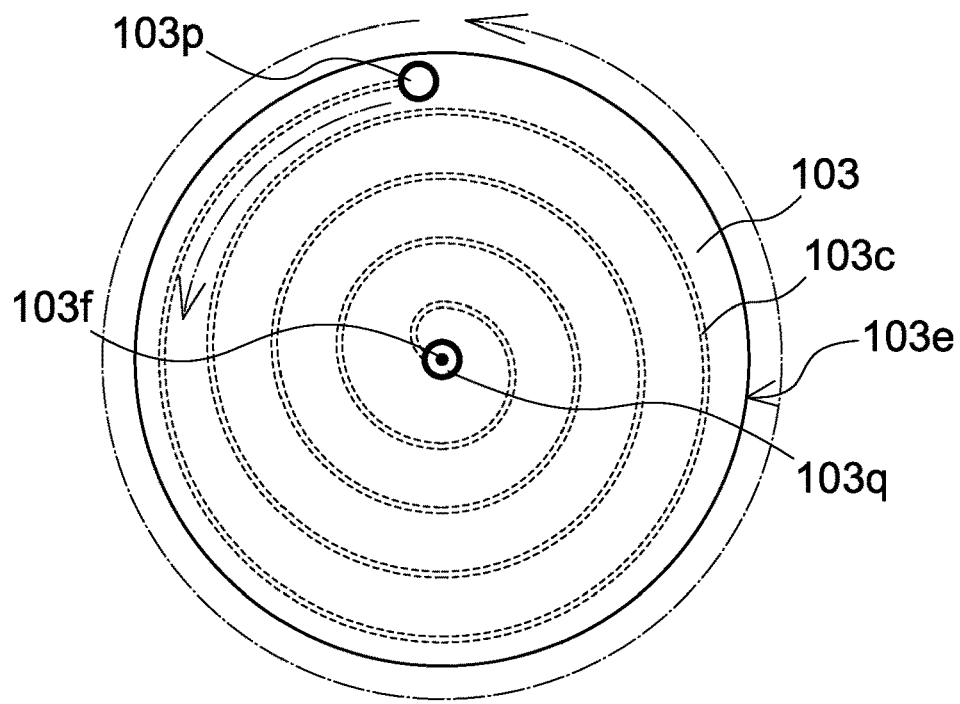
FIG. 13 is a schematic drawing showing exemplary LED substrates mounted in a conventional light irradiation device for thermal treatment.

(2) FIG. 10 and FIG. 11 are schematic views of the LED substrates 12 of the light irradiation devices 1 in other embodiments as seen from a location at the +Z side thereof; and, in similar fashion as at FIG. 3, while in reality they would not actually be visible, the exemplary flow passage(s) 12$c$ which are formed toward the interior and through which liquid coolant C1 flows are shown in broken line. FIG. 11 and FIG. 12 are each such that the LED substrate 12 is constituted from a single substrate, these each, as viewed in the Z direction, being provided with a plurality of subdivided regions 12$r$, each of which is provided with inlet port(s) 12$p$, outlet port(s) 12$q$, and flow passage(s) 12$c$.

(3) It should be understood that the foregoing constitutions possessed by the light irradiation devices 1 that have been described above are merely exemplary, and the present invention is not to be limited by the respective constitutions shown in the drawings.

What is claimed is:

1. A light source unit that causes a workpiece to be irradiated with light, the light source unit being characterized in that it comprises:
    a plurality of LED elements;
    an LED substrate that has a mounting surface on which the plurality of LED elements are mounted and that comprises a plurality of subdivided regions arrayed in a circumferential direction at least at an outwardmost locus as viewed from a direction perpendicular to the mounting surface; and
    a cooling member which is provided at a surface on a side opposite the mounting surface of the LED substrate and at which provided at each of the plurality of subdivided regions there are an inlet port for flow thereinto of cooling medium for cooling the LED elements, an outlet port that is for discharge of the cooling medium and that is disposed more toward a center of the LED substrate than the inlet port as viewed from the direction perpendicular to the mounting surface of the LED substrate, and a flow passage which connects the inlet port and the outlet port and through an interior of which the cooling medium flows.

2. The light source unit according to claim 1 characterized in that arranged at the LED substrate there are a plurality of substrate subsets at which the subdivided regions are respectively formed.

3. The light source unit according to claim 1 characterized in that the flow passage is constituted so as to be directed toward the center from a location toward a perimeter edge portion as viewed from the direction perpendicular to the mounting surface of the LED substrate.

4. The light source unit according to claim 1 characterized in that, as viewed from the direction perpendicular to the mounting surface of the LED substrate, the inlet port appears to overlap at least one of that or those among the LED elements which constitute an outer edge of a region in which the LED elements are arranged.

5. The light source unit according to claim 1 characterized in that, as viewed from the direction perpendicular to the mounting surface of the LED substrate, the plurality of subdivided regions are constituted so as to have rotational symmetry about the center of the LED substrate.

6. The light source unit according to claim 5 characterized in that, as viewed from the direction perpendicular to the mounting surface of the LED substrate, the plurality of subdivided regions are constituted so as to have point symmetry with respect to the center of the LED substrate.

7. The light source unit according to claim 1 characterized in that, as viewed from the direction perpendicular to the mounting surface of the LED substrate, the flow passages are constituted so as to have point symmetry with respect to the center of the LED substrate.

8. The light source unit according to claim 1 characterized in that a primary component of a material of the LED substrate is aluminum nitride or silicon nitride.

9. The light source unit according to claim 1 characterized in that formed at the mounting surface of the LED substrate are a first region, and a second region which is more toward the center of the LED substrate than the first region and at which a density with which the LED elements are arranged is less than that at the first region.

10. The light source unit according to claim 2 characterized in that the flow passage is constituted so as to be directed toward the center from a location toward a perimeter edge portion as viewed from the direction perpendicular to the mounting surface of the LED substrate.

11. The light source unit according to claim 2 characterized in that, as viewed from the direction perpendicular to the mounting surface of the LED substrate, the inlet port appears to overlap at least one of that or those among the LED elements which constitute an outer edge of a region in which the LED elements are arranged.

12. The light source unit according to claim 3 characterized in that, as viewed from the direction perpendicular to the mounting surface of the LED substrate, the inlet port appears to overlap at least one of that or those among the LED elements which constitute an outer edge of a region in which the LED elements are arranged.

13. The light source unit according to claim 10 characterized in that, as viewed from the direction perpendicular to the mounting surface of the LED substrate, the inlet port appears to overlap at least one of that or those among the LED elements which constitute an outer edge of a region in which the LED elements are arranged.

14. The light source unit according to claim 2 characterized in that formed at the mounting surface of the LED substrate are a first region, and a second region which is more toward the center of the LED substrate than the first region and at which a density with which the LED elements are arranged is less than that at the first region.

15. The light source unit according to claim 3 characterized in that formed at the mounting surface of the LED substrate are a first region, and a second region which is more toward the center of the LED substrate than the first region and at which a density with which the LED elements are arranged is less than that at the first region.

16. The light source unit according to claim 10 characterized in that formed at the mounting surface of the LED substrate are a first region, and a second region which is more toward the center of the LED substrate than the first region and at which a density with which the LED elements are arranged is less than that at the first region.

17. A light irradiation device characterized in that it comprises:
    a chamber that contains the workpiece;
    a support member that supports the workpiece within the chamber; and
    the light source unit according to claim 1 that causes light directed toward the workpiece to be irradiated therefrom.

18. The light irradiation device according to claim 17 characterized in that the light source unit is arranged outside the chamber.

* * * * *